Dec. 6, 1966 D. A. CUSANO ETAL 3,290,175

SEMICONDUCTOR PHOTOVOLTAIC DEVICES

Filed July 6, 1962

Inventors:
Dominic A. Cusano;
Richard L. Sormberger,
by Joseph V. Claeys
Their Attorney.

United States Patent Office 3,290,175

Patented Dec. 6, 1966

3,290,175

SEMICONDUCTOR PHOTOVOLTAIC DEVICES

Dominic A. Cusano, Schenectady, and Richard L. Sormberger, Ballston Lake, N.Y., assignors to General Electric Company, a corporation of New York Filed July 6, 1962, Ser. No. 208,081
10 Claims. (Cl. 136—89)

Figure 1:
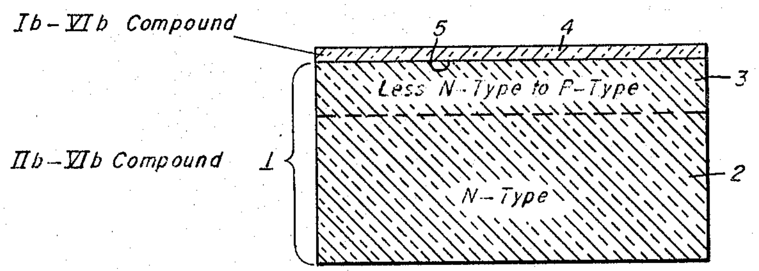

This is a continuation-in-part of our copending application Serial No. 22,248, filed April 14, 1960, assigned to the assignee of the present invention, and now abandoned.

The present invention relates to improved photovoltaic devices and more particularly, though not exclusively, to improved solar cells for the direct conversion of solar energy into electrical energy.

The desirability of utilizing the II*b*–VI*b* compounds for the fabrication of P-N junction devices particularly photovoltaic devices such as solar cells has long been recognized. Prior art attempts to form P-N junctions in these II*b*–VI*b* compounds, with the exception of cadmium telluride, have not been entirely successful due to the extreme difficulty of imparting both conductivity types to these materials. For example, cadmium sulfide and cadmium selenide are presently obtainable only in intrinsic and N-type conductivity, while zinc sulfide and zinc telluride are presently obtainable only in intrinsic and P-type conductivity. Moreover, since the acceptor sites are usually very deep in these II–VI compounds, it is extremely difficult to obtain highly conductive P-type materials.

Due to the difficulty of forming P-N junctions in these II*b*–VI*b* compounds, therefore, P-N junction devices exhibiting the expected desirable optical characteristics of these materials have not been successfully produced heretofore. Moreover, although cadmium telluride P-N junction photovoltaic devices have been made, the high room temperature resistivity of the best obtainable P-type conductivity material contributes to the low efficiency presently observed in such devices. Thus, although cadmium telluride is an extremely attractive material for photovoltaic devices, particularly solar cells, it has not been possible heretofore to provide such devices with an efficiency greater than about 1 percent.

One apparent reason for the low efficiency of cadmium telluride solar cells is due to the high resistivity of the P-type conductivity material. Consequently, prior art attempts have been unsuccessful in producing a junction geometry of a P-type region on an N-type region wherein all of the following desirable criteria are achieved:

(1) A P-N junction sufficiently close to the illuminated surface.

(2) Extremely small to substantially no unnecessary P-type, highly resistive cadmium telluride phase beyond that required to provide the P-N junction region.

(3) Maximum of light transmission to the junction region, and (4) A barrier-free and resistance-free contact for "holes" at the illuminated or P-type surface of the cell.

It is an object of this invention, therefore, to provide new and improved photovoltaic devices incorporating P-N junctions therein and which utilize the desirable characteristics of the II*b*–VI*b* compounds.

Another object of this invention is to provide a solar cell which possesses all of the desirable features listed above and allows for the realization of higher solar conversion efficiencies than known heretofore.

Briefly stated, in accordance with one aspect of this invention, we provide P-N junction photovoltaic devices of unique construction wherein the N-type conductivity region is composed of a II*b*–VI*b* compound and the P-type conductivity region is composed of a I*b*–VI*b* compound. More specifically, the P-type conductivity region is composed of a I*b*–VI*b* compound wherein the Group I*b* element replaces the Group II*b* element of the compound of the N-type region.

In accordance with another aspect of this invention P-N junction photovoltaic devices having still greater efficiency are provided wherein there is provided a smooth conductivity transition region between the N-type conductivity II*b*–VI*b* compound region and the P-type conductivity I*b*–VI*b* compound region. Further, in this aspect of the invention the P-type region is made extremely thin. Thus, although the devices of this aspect of the invention comprise a heterojunction between two different semiconductive materials they are found to exhibit the electrical and thermal characteristics of the heterojunction but the desirable optical characteristics of a true homojunction in the II*b*–VI*b* compound.

Figure 2:
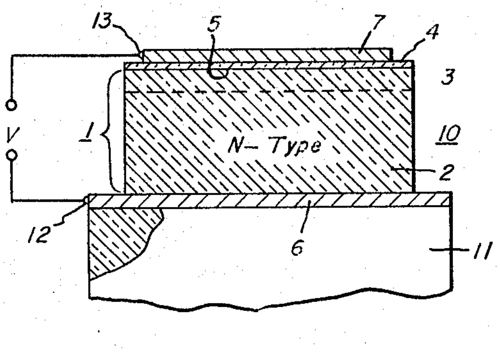
Figure 3:
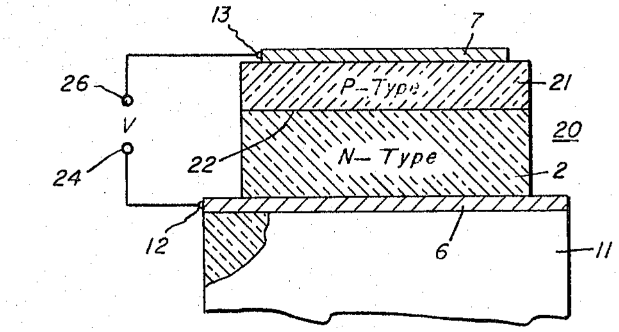

The novel features believed characteristic of this invention are set forth particularly in the appended claims. Our invention itself, however, both as to its organization and method of operation, together with further objects and advantages thereof, may best be understood by reference to the following description taken in conjunction with the following drawing wherein like reference numerals indicate the same or similar parts and in which:

FIG. 1 is a schematic sectional view of one preferred embodiment of a P-N junction structure in accordance with this invention, FIG. 2 is a schematic partially sectional illustration of an improved photovoltaic device utilizing the structure of FIG. 1, and FIG. 3 is a similar illustration of a photovoltaic device in accordance with another embodiment of this invention.

In FIG. 1 there is shown a P-N junction structure having the features of a preferred embodiment of this invention to provide for the construction of improved photovoltaic devices. As shown, the structure comprises a first portion, generally designated at 1, including an N-type conductivity region 2 and at least a surface-adjacent region 3 of a conductivity type which is in the range from less N-type than that of region 2 to slightly P-type. For example, region 3 may be in the range from N-type, compensated, to slightly P-type. Conveniently, for example, the material comprising portion 1 may have a thickness in the range of about 5–15 microns. Although the thickness of the less N-type to slightly P-type region 3 is not extremely critical, it is preferably in the range of about 0.2 to 2 microns. Alternatively, the conductivity type of the entire portion 1 may be non-uniform such that there is a conductivity transition from N-type toward P-type from one broad surface thereof to the other. Contiguous with region 3 is a P-type conductivity region 4 which is extremely thin, preferably in the range of about 10 to 100 angstrom units.

First portion 1 including N-type region 2 and its less N-type to slightly P-type region 3 is composed of a II*b*–VI*b* semiconductive compound such as a sulfide, selenide or telluride of zinc or cadmium or mixtures thereof. Portion 1 may be composed, therefore, of one of the efficient phosphor materials such as any member of the zinc-cadmium sulfo-selenide family of phosphors including zinc sulfide, cadmium sulfide, zinc selenide, cadmium selenide, zinc-cadmium sulfide, zinc-cadmium selenide, zinc sulfo-selenide, cadmium sulfo-selenide, zinc cadmium sulfo-selenide, zinc oxide and mixtures thereof. For the most efficient photovoltaic devices, especially solar cells, however, the preferred materials for portion 1 are cadmium telluride and cadmium sulfide.

The thin P-type conductivity region 4 is a compound having a cation selected from Group I*b* of the Periodic Table, preferably copper, and has the same anion as that of portion 1, namely an element from Group VI*b* of the Periodic Table other than polonium. For example, a preferred typical solar cell may comprise a first portion 1 of cadmium telluride wherein region 2 is strongly N-type and region 3 is weakly N-type, compensated or weakly P-type and a P-type region 4 of copper telluride ($Cu_xTe$). The term "copper telluride" is employed herein since the compound need not be stoichiometric cuprous telluride ($Cu_2Te$).

In the foregoing described structure there is provided a middle region 3 between the N-type conductivity region 2 and the P-type conductivity region 4. Since this middle region 3 is less N-type, compensated or slightly P-type there is a broad transition, or P-N junction, region established between the I*b*–VI*b* compound of region 4 and the II*b*–VI*b* compound of portion 1. This P-N junction region is designated generally by the arrow 5 since it is established as a total junction between the P-type region 4 and the portion 1 which includes the regions 2 and 3. It is to be understood, therefore, that there is no abrupt P-N junction such as would ordinarily be established between two highly impregnated opposite conductivity type regions. It is this conductivity type-modified region 3 which makes it possible to combine the otherwise conflicting electrical and thermal properties of a heterojunction with the desirable optical characteristics of a true homojunction in the desirable II*b*–VI*b* material.

The structure of FIG. 1 may be utilized to make the improved photovoltaic device shown more particularly in FIG. 2. As shown, the improved device comprises the structure of FIG. 1 in conjunction with appropriate electrically conductive layers 6 and 7, at least one of which is preferably transparent, which make nonrectifying contact with the respective regions 2 and 4. The electrically conductive layers may be, for example, thin layers of a metal which makes nonrectifying contact to the respective regions 2 and 4, or thin layers of tin oxide or reduced titanium dioxide. In addition, a convenient material for the electrically conducting layer 6 contacting the N-type conductivity II*b*–VI*b* compound region 2, particularly for the construction of solar cells employing the preferred cadmium telluride and cadmium sulfide materials, is electrically conducting cadmium sulfide. For example, layer 6 may be a thin layer of CdS:I, Ga so that since generally the same impurities can be used to render both cadmium telluride and cadmium sulfide of N-type conductivity, a nonrectifying contact is readily provided between layer 6 and the region 2. In yet another alternative the outer surface portions of N-type region 2 and P-type region 4 may be made very low resistivity so that these portions may themselves be utilized as the electrically conducting layers 6 and 7.

In FIG. 2 there is shown a photovoltaic device 10 utilizing the structure of FIG. 1. For simplicity device 10 will be described in detail with respect to a solar cell utilizing cadmium telluride as the II*b*–VI*b* compound of first portion 1. Device 10 may be conveniently fabricated upon a glass plate 11. This may be accomplished by supporting plate 11 horizontally within an evacuated bell jar and producing thereupon first an electrically conducting layer 6 of CdS:I, Ga and then a layer of N-type conductivity cadmium telluride substantially as disclosed in U.S. Patent No. 2,685,530, Cusano and Studer. Region 3, compensated, or slightly P-type of less N-type conductivity, may be conveniently produced by modifying the reactants during the final stages of the foregoing vapor reaction deposition of the cadmium telluride. High efficiency N-type conductivity cadmium telluride layers having a less N-type, compensated, or slightly P-type region associated therewith may be produced, for example, by carrying out the vapor reaction deposition of cadmium telluride using cadmium, cadmium iodide and tellurium as the initial reacting materials to produce N-type region 2. The less N-type, compensated or slightly P-type region 3 is then produced thereon by adding cuprous chloride or other acceptor impurity to the initial reacting materials during the final stages of the deposition whereby a less N-type, compensated or slightly P-type region is formed.

Alternatively, the less N-type, compensated or slightly P-type region 3 may be produced in accordance with other techniques well-known in the art, such as for example, surface diffusion, gradual cooling to allow for the formation of native acceptor states, or hot gas surface treatment, as well as other techniques known in the art for providing this result. These latter methods are often particularly suitable for modifying the conductivity type of the surface especially when first portion 1 is a single crystal body rather than a deposited layer.

A P-type conductivity region 4, composed of the cation of Group I*b* and the anion of the Group II*b*–VI*b* compound, is provided contiguous with the region 3. Conveniently, the glass plate having the deposited II*b*–VI*b* compound portion 1 thereon may be treated in a suitable bath containing a solute which will replace the cation of the deposited layer in the crystal lattice thereof in the exposed surface adjacent region to produce a very thin surface adjacent region of a Group I*b*–VI*b*, P-type conductivity material. Preferably, the plate is submerged in a bath in which the replacing I*b* ion is present in the monovalent state. For the device of FIG. 2, therefore, the deposited cadmium telluride layer may be immersed for several seconds in an aqueous $Cu^+$ solution at about 85° C. to form a very thin, highly electrically conducting, and at least semi-transparent, P-type phase of copper telluride. Further details of the formation of thin surface adjacent regions of P-type conductivity I*b*–VI*b* compounds such as utilized in the production of devices of this invention may be had by reference to our copending application Serial No. 22,247, filed April 14, 1960, now abandoned, the disclosure of which is incorporated herein by reference.

After the first portion 1 of II*b*–VI*b* material, including regions 2 and 3, and the P-type I*b*–VI*b* region 4 have been formed, a thin layer 7 of a metal which forms a nonrectifying contact to P-type region 4, such as for example copper, nickel, silver, gold, or the like may be formed on the exterior surface of P-type region 4. Layer 7 may be produced by evaporation, spraying or other suitable techniques well known in the art. To assure maximum illumination to the P-N junction, electrically conducting metal layer 7 may be conveniently of a grid-type structure. Such grid-type transparent electrodes are well known in the art in the construction of devices of this type. Terminals 12 and 13 are connected to electrically conducting layers 6 and 7, respectively, to complete the improved photovoltaic device.

In the general operation of photovoltaic devices, light of an appropriate wavelength, for example, sunlight or a solar cell, falling on the P-N junction serves as a source of external energy to generate electron-hole pairs in the semiconductive material of the device. Because of the potential difference which exists at a P-N junction, holes and electrons move thereacross in opposite directions producing potential difference and a current flow capable of delivering power to an external circuit connected across terminals 12–13 of the device.

In the devices of the present invention illustrated in FIGS. 1 and 2, the P-type conductivity I*b*–VI*b* compound has relatively low resistivity so that even though provided extremely thin, preferably in the range of about 10 to 100 angstrom units, to reduce absorption and undesirable recombination losses, there is no undesirable series resistance so that such devices exhibit greatly increased efficiency. The region 3, which may have a conductivity type in the range from less N-type than the region 2, to compensated, to slightly P-type, thereby containing donors and acceptors in appreciable numbers, is an excellent phosphor. In addition, region 3 provides for a very smooth transition between the N-type conductivity II*b*–VI*b* compound and the P-type conductivity I*b*–VI*b* compound also contributing to the efficiency of the device. These unique structural features combine to make possible a device having a P-N heterojunction which exhibits the electrical and thermal characteristics of such a junction but the desirable optical characteristics of a true homojunction in a II*b*–VI*b* compound.

As presently understood the overall junction appears to combine an "indirect optical transition" I*b*–VI*b* semiconductor with a "direct optical transition" II*b*–VI*b* semiconductor; the indirect optical transition semiconductor allowing the optical properties of the desirable II*b*–VI*b* material to dominate in such photovoltaic devices. Further, it presently appears that the direct optical transition edge of the P-type I*b*-VI*b* compound region is substantially comparable to that of the II*b*–VI*b* compound region.

In a photovoltaic device, the indirect nature of absorption allows short wavelength radiation to easily reach the P-N junction since the coefficient of indirect absorption is usually 2 or 3 orders of magnitude smaller than that of direct absorption. With the extremely thin P-type I*b*–VI*b* region provided in accordance with the devices shown in FIGS. 1–3, therefore, the photovoltaic spectral response of the device corresponds to that of the II*b*–VI*b* compound but the electrical and thermal characteristics correspond to a complete P-N II*b*–VI*b* to I*b*–VI*b* junction.

In FIG. 3 there is shown an improved photovoltaic device having the structure and features of another embodiment of this invention. As shown, the structure of these devices is similar to that shown in FIGS. 1 and 2, however, adjacent P-type and N-type regions only are provided without utilizing the middle region 3 of less N-type, compensated or slightly P-type conductivity. Thus, although such devices are not as highly efficient as those constructed in accordance with the embodiments illustrated in FIGS. 1 and 2 they provide new and improved devices which are particularly useful for a great many applications and are more efficient than related prior art devices.

In FIG. 3 of the drawing there is shown an improved photovoltaic device in accordance with this structural embodiment of the invention. As shown, the device, generally designated at 20, includes a region 2 of N-type conductivity II*b*–VI*b* material such as a sulfide, selenide or telluride of zinc or cadmium or mixtures thereof, and preferably cadmium telluride or cadmium sulfide. Contiguous with region 2 is a P-type conductivity region 21 of a I*b*–VI*b* material. A P-N junction region 22 separates the N-type II*b*–VI*b* region 2 from the P-type I*b*–VI*b* region 21, a pair of electrically conducting layers 6 and 7, at least one of which is transparent, are provided in nonrectifying contact with the regions 2 and 21, respectively.

Preferably, the device of FIG. 3 is formed upon a glass plate 11 in substantially the manner described hereinbefore with respect to the device shown in FIG. 2. For example, after electrically conducting layer 6 and N-type conductivity II*b*–VI*b* region 2 have been deposited the surface adjacent portion of region 2 is transformed into a Group I*b*–Group VI*b* P-type conductivity semiconductive material by bathing in a suitable solution containing ions of a metal of Group I*b* of the Periodic Table, preferably monovalent copper ions, to produce a P-type semiconductive region 21 of a I*b*–VI*b* compound in accordance with the process disclosed and claimed in our foregoing referenced copending application. For example, the region 21 so formed may be P-type conductivity copper telluride or sulfide. The P-type conductivity I*b*–VI*b* region 21 of the structure embodiment illustrated in FIG. 3 is substantially thicker than the P-type conductivity I*b*–VI*b* region 4 of the embodiments shown in FIGS. 1 and 2.

Region 21 may be conveniently provided of the desired thickness, for example, by carrying out the bathing step in the monovalent Group I*b* ion solution for a longer period of time until a P-type conductivity I*b*–VI*b* region of desired thickness is produced.

A suitable conducting electrode 7, preferably metallic, which makes good nonrectifying contact to P-type region 21 is formed thereupon by evaporation, spraying, or other suitable methods to form a conducting electrode for the device. Silver, copper and like metals may be employed for this purpose.

When cadmium sulfide is used for the N-type region 2, for example, a resistivity as low as 0.02 ohm-centimeters may be obtained. Resistivities of the order of 0.01 ohm-centimeters may also be obtained for a P-type layer on the P-type side of the P–N junction by making this layer $Cu_2S$, for example. In addition to the preferred cadmium telluride and cadmium sulfide materials, other combinations such as are set forth herein and in our cross-referenced copending application and the aforementioned Cusano and Studer patent may likewise be utilized.

In the operation of the photovoltaic device of FIG. 3, incident radiation excites electron-hole pairs at the P-N junction by band-to-band excitation and by excitation of impurity sites, preceded or followed by thermal excitation. Under the influence of the field existing at the P-N junction, electrons created by incident radiation at the P-N junction are urged toward electrode 6 and positive holes are urged toward electrode 7. The electrons migrate through conductor 23 to terminal 24 and the positive holes migrate through conductor 25 to terminal 26 causing the creation of a potential difference V between terminals 24 and 26. This voltage depends upon the band-gap of the semiconductive material and may typically be from 0.2 to 2 volts.

It is to be noted that the entire composite region between the electrically conductive layers 6 and 7 in the various devices of this invention is formed from the original Group II*b*–VI*b* compound. Preferably, the N-type region is formed of the desired II*b*–VI*b* compound itself and the P-type region is formed thereon by a substitution of the group I*b* atoms for the group II*b* atoms in the crystal lattice of the compound to form the I*b*–VI*b* region. The crystal structure remains, however, and there are no discontinuities therein thus facilitating the free and unimpeded flow of charge carriers through the semiconductive material which is a necessary condition in the operation of all embodiments of this invention.

Further, in the embodiments illustrated particularly in FIGS. 1 and 2, the less N-type, compensated to slightly P-type middle region 3 provides for a smooth transition between the N-type conductivity material and the P-type conductivity material so that even though the device incorporates a P-N heterojunction it exhibits the electrical and thermal characteristics of such heterojunction but the unexpected and extremely desirable optical characteristics of a true homojunction in the attractive II*b*–VI*b* material. In addition, the thin I*b*–VI*b* P-type conductivity region, in addition to being an intimate part of the total P-N junction, is also the ohmic (hole) contact to the middle region 3 in those instances when region 3 has been made slightly P-type. In the photovoltaic devices of this invention the P-type I*b*–VI*b* region is sufficiently conductive, moreover, to represent negligible resistance between the region where electrons and holes are optically produced to the "hole" collecting electrically conducting layer 7. Such a structure, for example, provides solar cells, which possess the desirable features never before attained in the art. For example, this structure makes possible cadmium telluride solar cells which can be consistently produced, even under presently unoptimized conditions, having solar conversion efficiencies of 6 percent and more.

Although the present invention has been particularly described with respect to N-type conductivity vapor-reaction-deposited II*b*–VI*b* layers formed in accordance with U.S. Patent No. 2,685,530, and P-type conductivity I*b*–VI*b* layers formed in accordance with our aforementioned copending application, it is to be understood that the devices may be constructed from single crystal bodies or wafers of II*b*–VI*b* compounds or of layers of such materials produced in accordance with various other techniques known to the art. It is to be similarly understood that the P-type I*b*–VI*b* layer of the device may be produced by other techniques than that described.

While the invention has been set forth herein with respect to certain embodiments thereof, many modifications and changes may readily occur to those skilled in the art. Accordingly, by the appended claims we intend to cover all such modifications and changes as fall within the true spirit and scope of the invention.

What we claim as new and desire to secure by Letters Patent of the United States is:

1. A P-N junction structure comprising: first and second contiguous regions of a Group II*b*–VI*b* compound, said first region having N-type conductivity and said second region having a conductivity type in the range from less N-type than said first region to slightly P-type; and a third P-type conductivity region of a I*b*–VI*b* compound contiguous with said second region to establish a smooth P-N junction region between said II*b*–VI*b* compound regions and said I*b*–VI*b* compound region so that the electrical and thermal characteristics of the junction correspond to a P-N heterojunction between said II*b*–VI*b* and I*b*–VI*b* compounds and the optical characteristics of the junction correspond to a true homojunction in the II*b*–VI*b* compound.

2. The P-N junction structure of claim 1 wherein said third region of P-type conductivity I*b*–VI*b* material has a thickness in the range of about 10 to 100 angstrom units.

3. The P-N junction structure of claim 1 wherein said Group II*b*–VI*b* and said Group I*b*–VI*b* regions have the same anion.

4. A P-N junction structure comprising: first and second contiguous regions of a Group II*b*–VI*b* compound, said first region being of N-type conductivity and said second region being of less strongly N-type conductivity; a third P-type conductivity region of a I*b*–VI*b* compound contiguous with said second region; and a P-N junction region providing a smooth potential barrier between said N-type conductivity II*b*–VI*b* regions and said P-type I*b*–VI*b* region so that said junction exhibits the optical characteristics of a P-N junction in a II*b*–VI*b* compound.

5. A semiconductor photovoltaic device comprising: first and second contiguous regions of a II*b*–VI*b* compound, said first region having N-type conductivity and said second region having a conductivity type in the range from less N-type than said first region to slightly P-type; a third region of a I*b*–VI*b* compound of a P-type conductivity contiguous with said second region; a P-N junction region between said II*b*–VI*b* compound and said I*b*–VI*b* compound; and first and second electrically conductive layers in direct non-rectifying contact with said first N-type conductivity Group II*b*–VI*b* region and said third P-type conductivity I*b*–VI*b* region, respectively.

6. The semiconductor photovoltaic device of claim 5 wherein the Group II*b*–VI*b* and Group I*b*–VI*b* compounds have the same anion.

7. The semiconductor photovoltaic device of claim 5 wherein said third region of P-type conductivity I*b*–VI*b* material has a thickness in the range of about 10 to 100 angstrom units.

8. A solar cell structure comprising: a first region of cadmium telluride of N-type conductivity, a second region of cadmium telluride contiguous with said first region and having a conductivity type in the range from less N-type than said first region to slightly P-type; a thin region of copper tulluride of P-type conductivity contiguous with said second cadmium telluride region; a P-N junction separating said cadmium telluride and said copper telluride regions; an electrically conducting layer in direct non-rectifying contact with the surface of said first N-type conductivity cadmium telluride region; and a metallic solar energy transmissive electrically conducting layer in direct nonrectifying contact with the surface of said P-type conductivity copper telluride region.

9. The solar cell structure of claim 8 wherein said copper telluride region has a thickness in the range of about 10 to 100 angstrom units.

10. A semiconductor photovoltaic device comprising: a monocrystalline body of a Group II*b*–VI*b* compound whose bulk is of N-type conductivity having a surface-adjacent region of less strongly N-type conductivity; a region of P-type conductivity Group I*b*–VI*b* compound contiguous with the less N-type surface-adjacent region of said body; a P-N junction smoothly separating said N-type II*b*–VI*b* body from said I*b*–VI*b* region so that said junction exhibits the optical characteristics of a P-N junction in said II*b*–VI*b* compound; and first and second electrically conducting layers in direct non-rectifying contact with said N-type conductivity body and said P-type conductivity region, respectively.

References Cited by the Examiner

UNITED STATES PATENTS

| | | | |
|---|---|---|---|
| 2,685,530 | 8/1954 | Cusano et al. | 117—33.5 |
| 2,811,653 | 10/1957 | Moore | 307—88.5 |
| 2,817,799 | 12/1957 | Jenny | 317—237 |
| 2,929,859 | 3/1960 | Loferski | 136—89 |
| 3,082,131 | 3/1963 | Cornelison | 148—33 |
| 3,095,324 | 1/1963 | Cusano et al. | 117—215 |
| 3,121,808 | 2/1964 | Kahng et al. | 307—88.5 |

OTHER REFERENCES

Hodgman (ed.), "Handbook of Chemistry and Physics," 35th ed., Chem. Rubber Pub. Co., Ohio, 1953–1954, pages 392 and 393.

WINSTON A. DOUGLAS, *Primary Examiner.*

JOHN H. MACK, A. M. BEKELMAN, *Assistant Examiners.*